US009252293B2

(12) United States Patent
Ankoudinov

(10) Patent No.: US 9,252,293 B2
(45) Date of Patent: Feb. 2, 2016

(54) TRENCH FIELD EFFECT DIODES AND METHODS OF MANUFACTURING THOSE DIODES

(71) Applicant: Alexei Ankoudinov, Redmond, WA (US)

(72) Inventor: Alexei Ankoudinov, Redmond, WA (US)

(*) Notice: Subject to any disclaimer, the term of this patent is extended or adjusted under 35 U.S.C. 154(b) by 0 days.

(21) Appl. No.: 14/601,547

(22) Filed: Jan. 21, 2015

(65) Prior Publication Data

US 2015/0206984 A1     Jul. 23, 2015

Related U.S. Application Data

(60) Provisional application No. 61/930,278, filed on Jan. 22, 2014.

(51) Int. Cl.
| | |
|---|---|
| *H01L 29/06* | (2006.01) |
| *H01L 29/861* | (2006.01) |
| *H01L 29/872* | (2006.01) |
| *H01L 29/66* | (2006.01) |
| *H01L 29/417* | (2006.01) |
| *H01L 21/283* | (2006.01) |
| *H01L 21/311* | (2006.01) |
| *H01L 21/3213* | (2006.01) |

(52) U.S. Cl.
CPC ............ *H01L 29/861* (2013.01); *H01L 21/283* (2013.01); *H01L 21/31111* (2013.01); *H01L 21/31133* (2013.01); *H01L 21/31144* (2013.01); *H01L 21/32133* (2013.01); *H01L 21/32139* (2013.01); *H01L 29/417* (2013.01); *H01L 29/66136* (2013.01); *H01L 29/66143* (2013.01); *H01L 29/8725* (2013.01)

(58) Field of Classification Search
CPC .................... H01L 29/861; H01L 29/8613
USPC .................... 257/622, 124; 438/380
See application file for complete search history.

(56) References Cited

U.S. PATENT DOCUMENTS

| | | | |
|---|---|---|---|
| 5,072,266 A | 12/1991 | Bulucea et al. | |
| 5,365,102 A | 11/1994 | Mehrotra et al. | |
| 5,541,425 A | 7/1996 | Nishihara | |
| 5,818,084 A | 10/1998 | Williams et al. | |

(Continued)

OTHER PUBLICATIONS

B. Jayant Baliga, Power Semiconductor Devices, 1996, 72 pages, PWS Publishing Company, Boston, MA.
V. Rodov et al., Super Barrier Rectifier—A New Generation of Power Diode, Oct. 2006, 4 pages.

(Continued)

*Primary Examiner* — Theresa T Doan
(74) *Attorney, Agent, or Firm* — Kolisch Hartwell, P.C.

(57) ABSTRACT

Diodes and methods of manufacturing diodes are disclosed. The diodes may include a cathode assembly and an anode assembly having an anode electrode, a gate electrode layer under the anode electrode, a gate oxide layer under the gate electrode layer, at least one P– body region under the gate oxide layer, and at least one trench that extends through the gate electrode layer, the gate oxide layer, and the at least one P– body region to the cathode assembly. The at least one trench may include a lower portion having (1) a bottom and a plurality of sidewalls defining a bottom volume and having an insulating layer and (2) a conductive material that is disposed within the bottom volume and that is in electrical communication with the anode electrode. The anode electrode may contact extend through the at least one trench to the conductive material.

6 Claims, 8 Drawing Sheets

(56) References Cited

U.S. PATENT DOCUMENTS

| | | | |
|---|---|---|---|
| 5,866,931 A | 2/1999 | Bulucea et al. | |
| 6,031,265 A | 2/2000 | Hshieh | |
| 6,313,001 B1 * | 11/2001 | Johansson et al. | 438/340 |
| 6,373,097 B1 * | 4/2002 | Werner | 257/329 |
| 6,445,037 B1 | 9/2002 | Hshieh et al. | |
| 6,448,160 B1 | 9/2002 | Chang et al. | |
| 8,148,748 B2 | 4/2012 | Ankoudinov et al. | |
| 2012/0286356 A1 | 11/2012 | Hebert et al. | |

OTHER PUBLICATIONS

Prof. Tsu-Jae King, Lecture #21, Outline, The MOS Capacitor, Electrostatics, Apr. 17, 2003, 12 pages, University of California, Berkeley, http://www-inst.eecs.berkeley.edu/~ee130/sp03/lecture/lecture21.pdf.

Prof. Saraswat, Thin Dielectrics for MOS Gate, Apr. 9, 2004, 46 pages, Stanford University, http://web.stanford.edu/class/ee311/NOTES/GateDielectric.pdf.

* cited by examiner

TRENCH FIELD EFFECT DIODES AND METHODS OF MANUFACTURING THOSE DIODES

CROSS-REFERENCE TO RELATED APPLICATION

This application claims the benefit of U.S. Provisional Patent Application Ser. No. 61/930,278, filed Jan. 22, 2014 and entitled "Trench Field Effect Diode." The complete disclosure of the above provisional application is hereby incorporated by reference for all purposes.

BACKGROUND OF THE DISCLOSURE

Diodes function ideally as "one-way valves" in electronic circuits, allowing current to pass unhindered in one direction and blocking current in the opposite direction. Solid-state diodes are generally constructed from semiconductor crystals with different layers of the crystal having different electrical properties.

The most basic semiconductor diode is formed by adjoining two semiconductor crystals: one, called a P-type, that has been doped with atoms so that the majority of charge carriers are mobile positive holes, and the other, called a N-type, that has been doped with atoms so that the majority of charge carriers are negative electrons. This so-called "P-N junction" is connected to the rest of the circuit by attaching an anode material to the P-type semiconductor and a cathode material to the N-type semiconductor.

More complicated diodes can be constructed by having one or more layers of N-type semiconductor and/or one or more layers of P-type semiconductor, with different layers having different amounts of mobile charge carriers. In the case of a Schottky diode, the P-type material is omitted entirely with the anode connected directly to the N-type semiconductor.

An ideal diode will allow current to flow from the anode side to the cathode side with no drop in potential, and hence no loss of electrical energy. When current is flowing in this direction the diode is said to be in the "forward biased state." An ideal diode will also completely block current flowing in the opposite direction regardless of the applied voltage, which is called the "reverse biased voltage." An ideal diode will also be able to switch between these two operational modes instantaneously.

However, diodes do not function ideally. First, there is usually some small drop in potential when the diode is in the forward biased state. That is, there is some unwanted resistance to the free flow of current in the forward biased state, called "parasitic resistance." Depending on the intended application of the diode, the losses due to the parasitic resistance may be large and may adversely affect components downstream from the diode.

Diodes also do not completely block current in the reverse biased state. The small current that flows in the opposite direction during reverse bias is called a "leakage current" and it often increases as the reverse bias voltage increases. Eventually, the leakage current increases dramatically when the reverse bias voltage reaches some rated breakdown voltage. Diodes with a leakage current that does not increase with increasing reverse bias voltage are referred to as having a "flat leakage current."

Diodes also take time to switch between the on state and the off state. When conducting, the diode is flooded with electrons and holes moving in opposite directions. In order for the diode to transition to the off state this excess "stored charge" needs to be removed from the diode during what is called the "reverse recovery time."

SUMMARY OF THE DISCLOSURE

Some embodiments provide a diode. In some examples, the diode may include a cathode assembly. The cathode assembly may include a cathode electrode, a N+ substrate layer over the cathode electrode, and a N– bulk layer over the N+ substrate layer. The diode may additionally include an anode assembly. The anode assembly may include an anode electrode and a gate electrode layer under the anode electrode. The gate electrode layer may be shorted to the anode electrode. The anode assembly may additionally include a gate oxide layer under the gate electrode layer, and at least one P– body region under the gate oxide layer. The anode assembly may further include at least one trench that extends through the gate electrode layer, the gate oxide layer, and the at least one P– body region to the N– bulk layer.

The at least one trench may include an upper portion and a lower portion. The lower portion may have a bottom and a plurality of sidewalls defining a bottom volume. The bottom and the plurality of sidewalls may have an insulating layer. The lower portion may further have a conductive material that is disposed within the bottom volume and that is in electrical communication with the anode electrode. The insulating layer may be configured to electrically insulate the conductive material from the N– bulk layer. The anode electrode may extend through the upper portion of the at least one trench to the conductive material.

Some embodiments provide a method of manufacturing a diode. In some examples, the method may include creating a N– bulk layer over a N+ substrate wafer, and depositing a gate oxide layer on the N– bulk layer. The method may additionally include depositing a gate electrode layer on the gate oxide layer, and creating one or more P– body regions in the N– bulk layer. The method may further include creating one or more trenches through the gate electrode layer, the gate oxide layer, and the one or more P– body regions to the N– bulk layer, and applying an insulating layer in a lower portion of the one or more trenches. The method may additionally include depositing conductive material in the lower portion of the one or more trenches, and creating an anode electrode on the gate electrode layer. The anode electrode may extend downward through the one or more trenches to contact the conductive material in the lower portion of the one or more trenches. The method may further include creating a cathode assembly under the N+ substrate wafer.

In some examples, the method may include creating a N+ substrate layer in a N– bulk wafer, and depositing a gate oxide layer on the N– bulk wafer. The method may additionally include depositing a gate electrode layer on the gate oxide layer, and creating one or more P– body regions in the N– bulk wafer. The method may further include creating one or more trenches through the gate electrode layer, the gate oxide layer, and the one or more P– body regions to the N– bulk wafer, and applying an insulating layer in a lower portion of the one or more trenches. The method may additionally include depositing conductive material in the lower portion of the one or more trenches, and creating an anode electrode on the gate electrode layer. The anode electrode may extend downward through the one or more trenches to contact the conductive material in the lower portion of the one or more trenches. The method may further include creating a cathode assembly under the N+ substrate layer.

DETAILED DESCRIPTION OF THE DISCLOSURE

Figure 1:
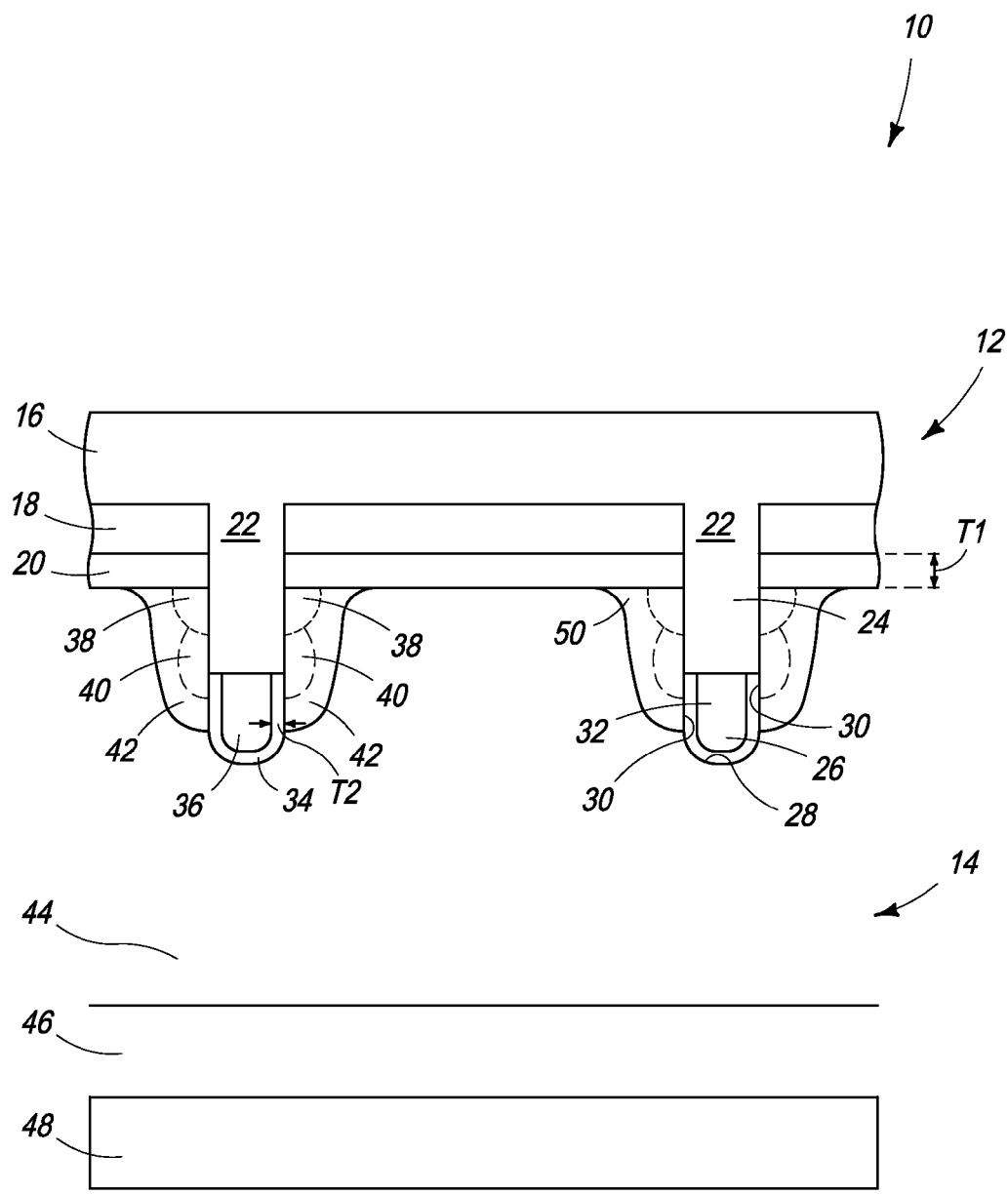
FIG. 1 is a schematic sectional view of an example of a diode.

FIG. 1 is a schematic sectional view of an example of a diode 10. Diode 10 may include any suitable structure configured to provide the diode with low parasitic resistance and a flat leakage current. Diode 10 may include an anode assembly 12 and a cathode assembly 14.

The anode assembly may include any suitable structure. For example, anode assembly 12 may include an anode electrode 16, a gate electrode layer 18, a gate oxide layer 20, one or more trenches 22, and at least one P− body region 42. Anode electrode 16 may be made of any appropriate metal(s). Additionally, anode electrode 16 may be shaped to extend through any suitable portion of one or more of trenches 22 (or all of those trenches), such as through an upper portion of trench(es) 22. Although anode electrode 16 is shown to be a unitary electrode that at least partially extends through one or more of trenches 22, the anode electrode may be made of two or more components that are in electrical communication with each other. For example, anode material (not shown) may be used in the trench(es) and that material may be in contact with the anode electrode.

Gate electrode layer 18 may be under or adjacent the anode electrode. The gate electrode layer may be made of any suitable conducting material(s), such as conducting material(s) with an appropriate work function. For example, gate electrode layer 18 may be composed of highly doped N-type polysilicon. The concentration of doping atoms may, for example, be between about $10^{20}$ and about $10^{21}$ atoms per cubic centimeter. The gate electrode layer may have a thickness between about 600 and about 2000 angstroms, though other thicknesses may also be used. Gate electrode layer 18 may be disposed underneath the anode electrode and/or may be shorted to the anode electrode.

Gate oxide layer 20 may be disposed under/or adjacent gate electrode layer 18. The gate oxide layer may have a first thickness T1 of about thirty to two hundred angstroms, which may sometimes be referred to being a "thin layer." The gate oxide layer may be an insulating layer made of any suitable materials. For example, the gate oxide layer may be composed of silicon dioxide, silicon oxynitride, and/or any other suitable dielectric material(s).

The anode assembly may include one or more trenches 22 that extend through any suitable layer(s). For example, one or more of trenches 22 (or all of those trenches) may extend from the anode electrode down through the gate electrode layer and/or the gate oxide layer. In some examples, one or more of trenches 22 may extend through the gate electrode layer and the gate oxide layer to one or more portions of the cathode assembly. One or more of trenches 22 (or all of those trenches) may include an upper portion 24 proximate the anode electrode and a lower portion 26. The lower portion may have a bottom 28 and a plurality of sidewalls 30 which may be referred to as defining a bottom volume 32.

Bottom 28 and/or one or more of sidewalls 30 may be lined with an insulating material or insulating layer 34, which may include any suitable structure configured to electrically insulate the trench from the cathode assembly, such as from the N− bulk layer discussed below. The insulating material 34 may have a second thickness T2 in a range of about 400 to about 1500 angstroms, which may sometimes be referred to as being a "thick layer." In some examples, the second thickness of the insulating material may be larger than the first thickness of the gate oxide layer. The insulating material may be any suitable material(s) capable of withstanding high electric fields. For example, insulating material 34 may be a single oxide layer or a nitride layer together with an oxide layer.

The bottom volume may include a conductive material 36, such as above or on top of bottom 28 and/or between the insulated sidewalls. In other words, conductive material may be disposed within bottom volume 32, for example, conductive material 36 may be disposed between opposing sidewalls of plurality of sidewalls 30. In some examples, lower portion 26 and/or bottom volume 32 may be filled with conductive material 26. Conductive material 36 may be any conductor with suitable work function, for example, highly doped P-type polysilicon, highly doped N-type polysilicon, and/or one or more metals. In the case of highly doped polysilicon, N-type or P− type, the concentration of doping atoms may be above about $10^{19}$ atoms per cubic centimeter. Conductive material 36 may be electrically insulated from the cathode assembly, such as the N− bulk layer described below, via the insulating material. The conductive material may be in electrical communication with the anode electrode. In some examples, anode electrode 16 may extend to contact the conductive material. The anode electrode may be configured to make contact with the gate electrode layer and conductive material 36 (and N+ and/or P+ contact areas as discussed below) on one side and electrical contact with the rest of a circuit on the other side.

Trenches 22 may have any suitable shape(s). For example, one or more of trenches 22 (or all of those trenches) may be rectangular or it may be U-shaped (such as with rounded corners), which may avoid high electric field magnitudes that may form at the corners of a trench. In some examples, the width of one or more trenches 22 (or all of those trenches) may be between about 0.5 and about 1 micron and the depth may be between about 2 and about 10 microns.

In some examples, one or more of trenches 22 (or all of those trenches) may have associated one or more P− body regions 42. Although "P" is used for clarity, body region 42 may be a second conductive type that could either be P-type or N-type. The "P−" is used herein to indicate that the P− body region(s) may have a lower concentration of doping atoms than, for example, the P+ contact area(s) discussed below. The P− body region may be disposed under or adjacent the gate oxide layer. The concentration of doping atoms may enable a flat leakage current during reverse biased operation of the diode between about 1 volts and a rated voltage, such as between about $10^{17}$ and about $10^{18}$ atoms per cubic centimeter. The P− body region may contact gate oxide layer 20 and/or may contact the cathode assembly, such as the N− bulk layer discussed below. P− body region 42 may also, when diode 10 includes N+ and/or P+ contact areas as discussed below, be in contact with one or both of the N+ and P+ contact areas and may be disposed around both of the contact areas.

In some examples, one or more of trenches 22 (or all of those trenches) may have one or more associated N+ contact areas 38. The N+ contact area may be considered to be a source contact. The "N+" is used herein to indicate that (1) the semiconductor is a N-type and (2) it has been doped to a higher concentration than, for example, the N− bulk layer discussed below. However, the source contact may be described as being of a first conductive type that could be N-type or P-type. The N+ contact area may have a concentration of doping atoms above about $10^{19}$ atoms per cubic centimeter. This concentration may allow ohmic contact between the N+ contact area and the upper portion of one or more trenches 22 so that, for example, electrons can readily flow between the anode and the N+ contact area.

In some examples, one or more trenches 22 (or all of those trenches) may have one or more associated P+ contact areas 40. The label "P+" is used herein to indicate that (1) the semiconductor is a P-type and (2) it has been doped to a higher concentration than, for example, the P− body region discussed above. However, the P+ contact area may be described as being of a second conductive type that could be P− type or N-type. P+ contact area 40 may have a concentration of doping atoms that is configured to allow ohmic contact with the upper portion of trench 22 so that holes can readily flow between the anode and the P+ contact area. For example, the P+ contact area may have a concentration of doping atoms above about $3\times10^{17}$ atoms per cubic centimeter.

Although diode 10 is shown in FIG. 1 to include, in some examples, N+ contact areas 38 and P+ contact areas 40, other examples of diode 10 may exclude N+ and P+ contact areas or may include only N+ contact areas 38 or only P+ contact areas 40.

Cathode assembly 14 may include a N− bulk layer 44, a N+ substrate layer 46, and a cathode electrode 48. The N− bulk layer may be connected to anode assembly 12 and/or may be on or over N+ substrate layer 46. For example, one or more of trenches 22 may extend from anode electrode 16 down through P− body region 42 and into N− bulk layer 44 so that the N− bulk layer is in contact with the lower portion 26 of one or more trenches 22 (or all of those trenches). In some examples, N− bulk layer may contact lower portion 26 but not upper portion 24 of one or more trenches 22 (or all of those trenches). The "N−" is used herein to indicate that (1) the semiconductor is a N-type, and (2) it has a lower concentration than, for example, N+ contact area 38. However, bulk layer 44 may be described as being of a first conductive type that could be N-type or P-type. The thickness and doping concentration of the N− bulk layer may be configured based on a predetermined breakdown voltage. For example, the concentration of doping atoms may be between about $3\times10^{14}$ and about $3\times10^{16}$ atoms per cubic centimeter.

N+ substrate layer 46 may be disposed over or adjacent cathode electrode 48 and/or underneath or adjacent N− bulk layer 44. In some examples, N+ substrate layer 46 may be disposed between N− bulk layer 44 and cathode electrode 48. The "N+" is used herein to indicate that (1) the semiconductor is a N-type, and (2) it has a higher concentration than, for example, N− bulk layer 44. However, substrate layer 46 may be described as being of a first conductive type that could be N-type or P-type. The N+ substrate layer may have a concentration of doping atoms that is configured to allow ohmic contact with cathode electrode 48. For example, the concentration of doping atoms in N+ substrate layer 46 may be above about $10^{19}$ atoms per cubic centimeter. N+ substrate 46 and the N− bulk layer 44 may together be referred to as a "drain region" of the first conductive type that is connected to P− body region 42.

Cathode electrode 48 may be made of any appropriate metal(s). The cathode electrode may be configured to make ohmic contact with N+ substrate layer 46 on one side and electrical contact with the rest of a circuit on the other side.

When diode 10 is in a forward biased state, that is, when the anode electrode is at a higher electrical potential than the cathode electrode, a conducting channel 50 may be formed in the P− body region(s) 42 adjacent to gate oxide layer 20. The gate electrode layer may, in some examples, be shorted to anode electrode 16 so that the gate electrode will also be at a higher electrical potential than the cathode electrode. As the P− body region(s) are separated from the gate electrode layer by thin gate oxide layer 20, the mobile positive holes in the P− body region(s) may be repelled by the higher potential of the gate electrode and may move away from the gate oxide layer, leaving behind a negatively charged depletion layer adjacent to the gate oxide layer. Also, the energy level bands in the semiconductor may bend downwards near the gate oxide layer, increasing the number of mobile electrons in an inversion layer directly adjacent to the gate oxide layer. Conducting channel 50 may be formed in the inversion layer within each of the one or more P− body regions. When the diode is in a forward biased state, electrons may flow upward from the cathode electrode through the N-type layers into the area between two of trenches 22, then may flow horizontally through conduction channel 50 beneath the gate oxide layer, then may flow through the N+ contact areas (when present) and into the anode electrode.

When diode 10 is in a reverse biased state, such as when the cathode electrode is at a higher electrical potential than the anode electrode, no such conducting channel may be formed in the P− body region. Furthermore, during reverse bias, the depletion regions associated with one or more trenches 22 may extend away from those trenches and merge in the regions between the trenches. With the edges of the depletion region removed from proximity to the metal contacts there will be no barrier lowering affects, such as those due to image charge formation and the diode may exhibit a flat leakage current.

For some applications it may be preferable for diode 10 to exclude either or both of N+ contact areas 38 and P+ contact areas 40, such as when the diode is to have a low rated voltage. For low rate voltages, diode 10 may be a majority carrier device. In other words, the current may be primarily due to the movement of electrons and not the movement of holes. When the diode is in a forward biased state, the electrons may flow upward from the cathode electrode, through the N-type layers into the area between two adjacent trenches, then horizontally through conduction channel 50 in the P− body region(s) beneath the gate oxide layer and directly into anode electrode 16. Along this path, electrons may encounter (a) a Schottky barrier where the metal of the anode electrode connects with the semiconductor material of the P− body region and/or (b) a channel barrier in conducting channel 50. The height of the Schottky barrier may be determined by the materials used for the anode electrode and the P− body region, as well as the metallurgic quality of the contact between those two materials. This metallurgic quality may be difficult to control and there may subsequently be large variations in the height of the Schottky barrier. The channel barrier may be more easily controlled and determined by the concentration of doping atoms in the P− body region, the width of the P− body region that the electrons will travel through, the thickness of the gate oxide layer, and/or the work function of the gate electrode layer above the gate oxide layer. Whichever of these two barriers is higher will determine the behavior of the diode. In some examples, it may be preferable that the channel barrier height is larger than the Schottky barrier height.

Figure 2:
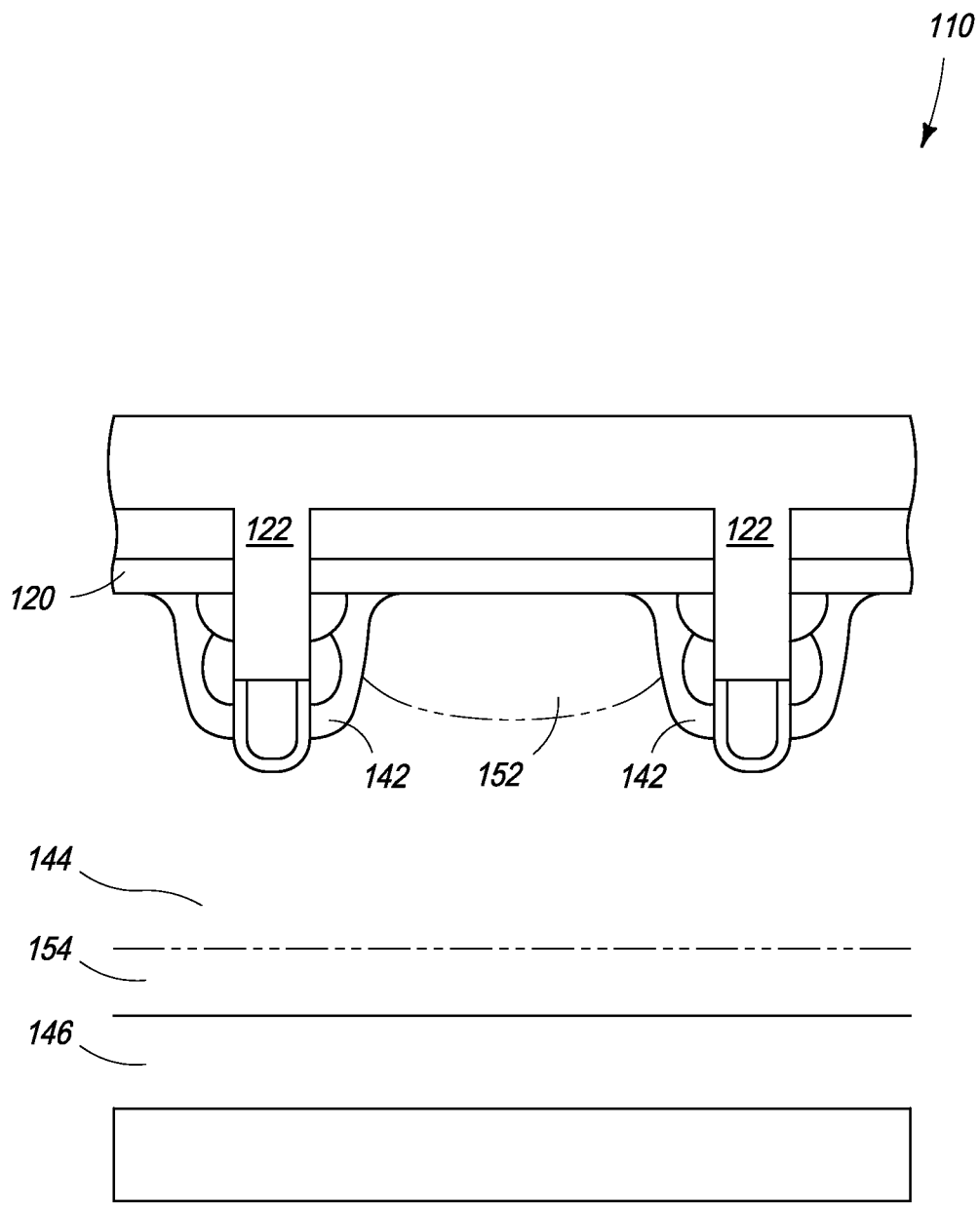
FIG. 2 is a schematic sectional view of another example of the diode of FIG. 1.

FIG. 2 is a schematic sectional view of another example of diode 10, which is generally indicated at 110. The numbered elements of diode 110 may correspond to similarly numbered elements of diode 10 in FIG. 1. The size, composition, and doping concentrations of the various components of diode 10 may be similar to those of diode 110. Diode 110 may include at least one N region 152 in between two adjacent trenches 122 and a N buffer layer 154 disposed between a N– bulk layer 144 and a N+ substrate layer 146. In some examples, at least one N region 152 may be in between every two adjacent trenches 122.

The at least one N regions 152 may be disposed under the gate oxide layer 120 and between two P– body regions 142 associated trenches 122. The N regions may be created, for example, by implanting additional donor atoms into the N– bulk layer thus increasing the concentration of doping atoms, as further described below. The concentration of doping atoms in the N region(s) may be between about $10^{16}$ and about $10^{17}$ atoms per cubic centimeter. The N region(s) may decrease the series resistance of diode 110 as compared to diode 10 without significantly reducing the breakdown voltage.

N buffer layer 154 may be disposed between the N– bulk layer 144 and the N+ substrate layer 146. "N" is used herein to indicate that buffer layer 154 is a N-type semiconductor and the lack of a "+" or a "–" indicates that the buffer layer may have a concentration of dopant atoms that is in between the concentrations in the N– bulk layer and the N+ substrate layer. For example, the concentration of doping atoms in the N buffer layer may be between about $10^{16}$ and about $10^{17}$ atoms per cubic centimeter. The thickness of the N buffer layer may be between about 5 and about 10 microns. For certain applications, for example in high voltage situations, the presence of the N buffer layer may allow for a reduced thickness of N– bulk layer 144. The presence of the N buffer layer also may allow for the reduction of the amount of stored charge that builds up during forward conduction in the diode. This stored charge must be removed before the diode can adequately block current in the reverse biased state. Although FIG. 2 shows diode 110 with both the N region(s) and the N buffer layer, diode 110 may have one, both, or neither of N region(s) 152 and N buffer layer 154.

Figure 3:
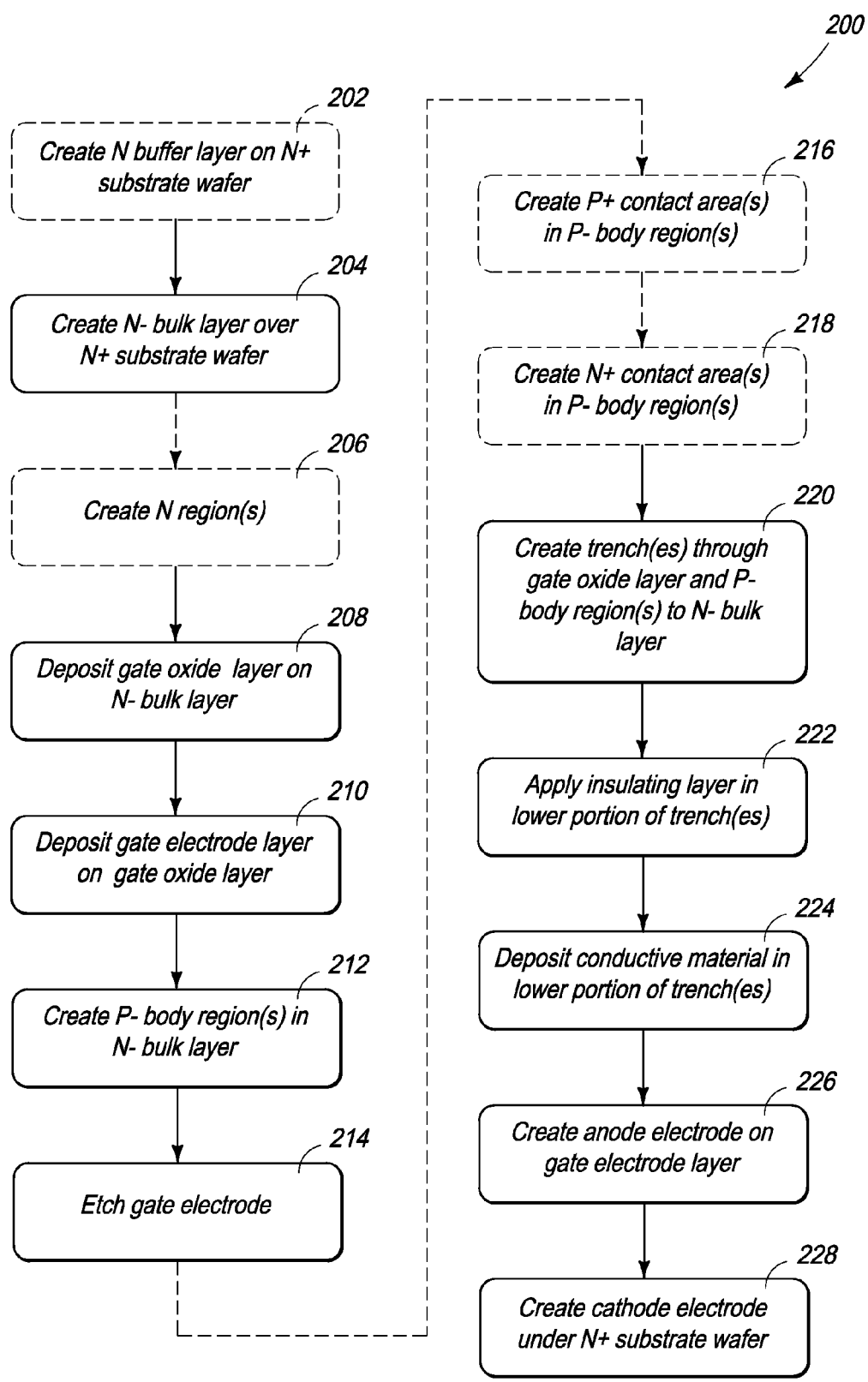
FIG. 3 is a flow chart of an example of a method of manufacturing a diode.

FIG. 3 shows an example of a method of manufacturing a diode (such as diode 10 or 110), which is generally indicated at 200. In the following discussion of method 200, most numbered elements will refer to diode 10, though that they could refer to the corresponding numbered elements of diode 110 and/or one or more other diodes.

At 204, a N– bulk layer may be created over a N+ substrate wafer. The N+ substrate wafer may be created via the Czochralski method and/or any suitable method(s). The N– bulk layer may, for example, be deposited via epitaxial growth on the N+ substrate layer. If optional step 202 described below is completed, then the N– bulk layer may be deposited via epitaxial growth on a N buffer layer.

At 208, a gate oxide layer may be deposited on the N– bulk layer. The gate oxide layer may be an insulating layer composed of silicon dioxide, silicon oxynitride, and/or any other suitable dielectric material(s). At 210, a gate electrode layer may be deposited on the gate oxide layer.

Figure 5:
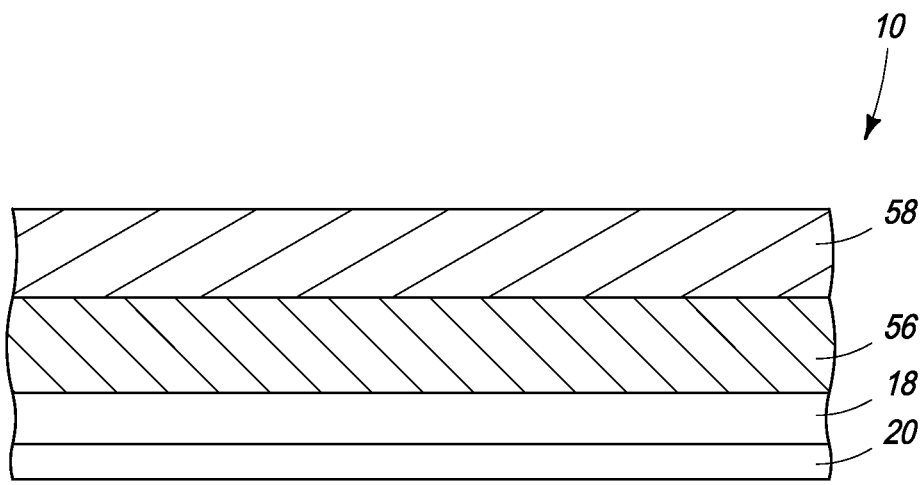
FIGS. 5-11 are schematic sectional views of a diode being manufactured according to the method of FIG. 3 or FIG. 4.

At 212, one or more P– body regions may be created in the N– bulk layer. Creating the one or more P– body regions may include, for example, depositing a nitride layer on the gate electrode layer and/or depositing a photoresist layer on the nitride layer. FIG. 5 shows diode 10 during an intermediate step of being manufactured according to method 200 where a nitride layer 56 lies over or on the gate electrode layer 18 and gate oxide layer 20 and a photoresist layer 58 lies over or on the nitride layer. The photoresist layer 58 may then be etched so that one or more portions of the photoresist layer are removed.

Figure 6:
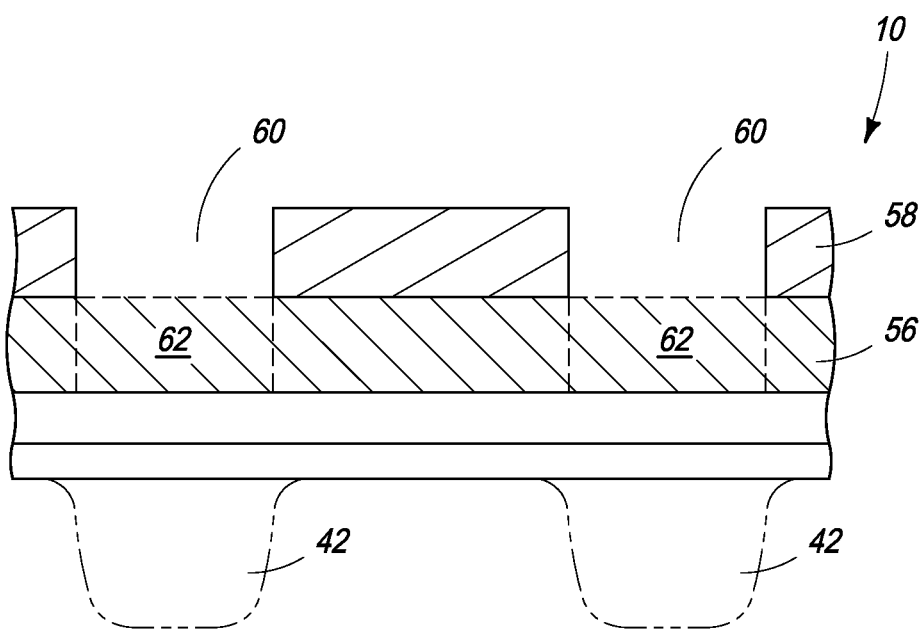

FIG. 6 shows diode 10 during an intermediate step of being manufactured according to method 200 where one or more portions 60 of the photoresist layer 58 have been etched or otherwise removed. After the photoresist layer has been etched, nitride layer 56 may be etched so that one or more portions 62 of the nitride layer may be removed. The dashed lines in FIG. 6 indicate the portions of the nitride layer that may be removed. During subsequent steps when the surface of the diode is irradiated with ions, the remaining nitride layer may prevent those ions from penetrating the surface of the diode. The parts of the diode underneath the portions 62 of the nitride layer that have been removed will not have this protection and the irradiating ions will penetrate the diode, potentially changing the properties of the affected layers of the diode, for example, increasing the concentration of doping atoms and/or changing the type of doping atoms. The remaining nitride layer may sometimes be referred to as a "mask." Alternatively, the nitride layer in FIG. 6 may sometimes be referred to as a "channel mask." The channel mask is used to create one or more P– body regions where conducting channel 50 will form during forward biased operation of the diode. Creating one or more P– body regions may include irradiating the N– bulk layer with ions through the channel mask, the ions being configured to create one or more P– body regions in the N– bulk layer. The P– body regions are indicated in FIG. 6 by the dash-dot-dot lines. The remainder of photoresist layer 58 may then be removed.

Figure 7:
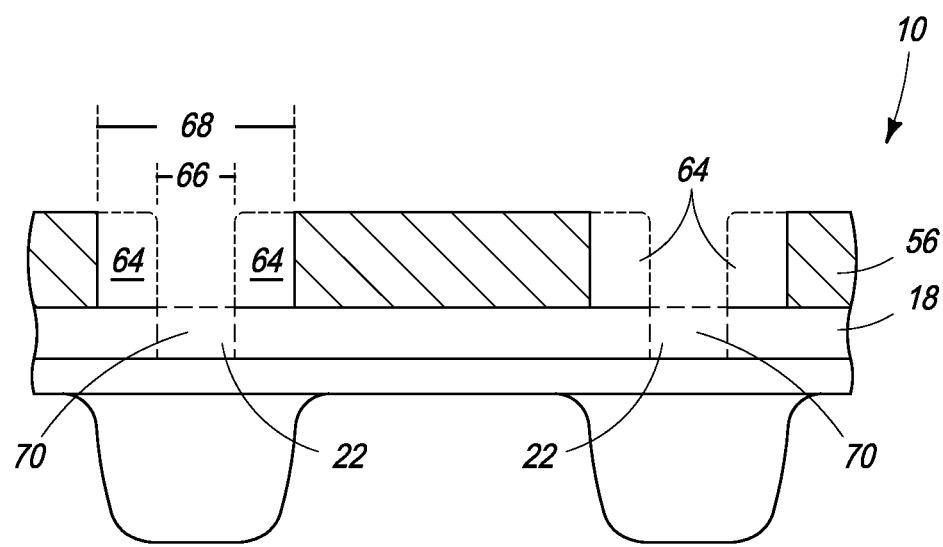

At 214, the gate electrode layer may be etched or otherwise removed. FIG. 7 shows diode 10 during an intermediate step of being manufactured according to method 200 where the photoresist layer of step 212 has been removed. Nitride sidewalls 64 may be added to nitride layer 56 to create one or more trench masks. The one or more trench masks may have any suitable width, such as a width 66 smaller than a width 68 of the one or more channel masks. The trench mask(s) may, for example, be the combination of nitride layer 56 and nitride sidewalls 64. With the trench mask in place, one or more portions 70 of the gate electrode layer 18 may be etched or otherwise removed. The etching of the gate electrode layer may sometimes be referred to as an initial sub-step of making the one or more trenches 22.

Figure 8:
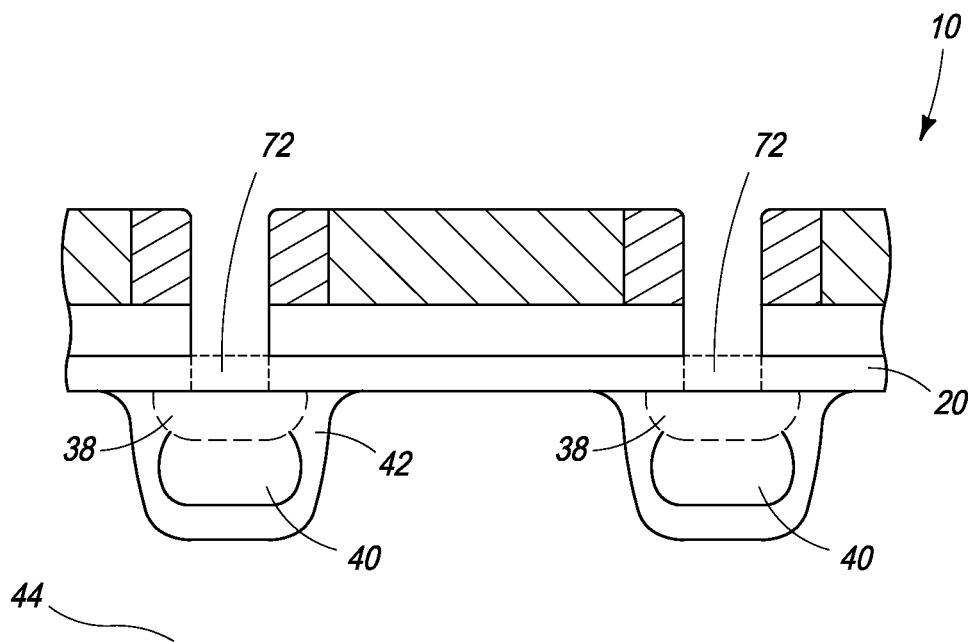
Figure 9:
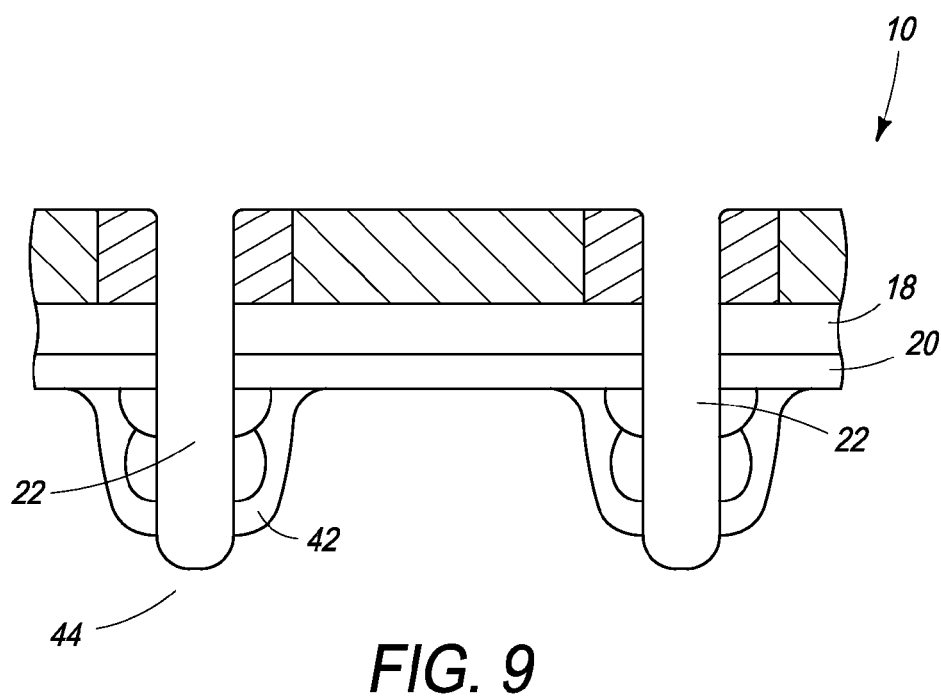

At 220, one or more trenches may be created through the gate oxide layer and the one or more P– body regions to the N– bulk layer. FIG. 8 shows diode 10 during an intermediate step of being manufactured according to method 200 where the gate electrode layer 18 has been etched. The trenches are continued as portions 72 of the gate oxide layer 20 are etched using the trench mask that was created, for example, in step 214. The one or more trenches may be completed when they are further etched down through P– body regions 42 and into N– bulk layer 44 using the trench mask that was created, for example, in step 214. FIG. 9 shows diode 10 during an intermediate step of being manufactured according to method 200 where the trenches 22 have been completely etched through the gate electrode layer 18, the gate oxide layer 20, the P– body region 42, and into the N– bulk layer 44. The shape of the bottom of each trench may be U-shaped, such as with rounded or curvilinear corners. However, other examples of the trenches may have sharper and/or rectilinear corners.

Figure 10:
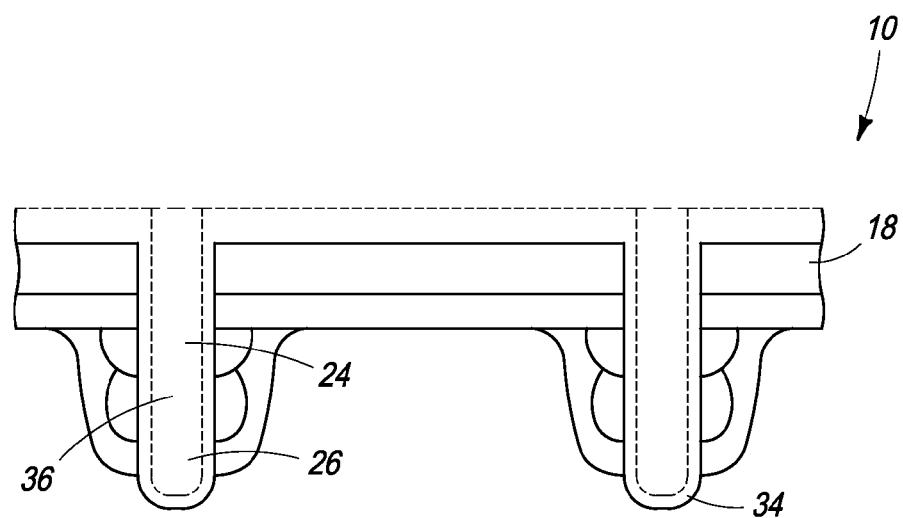

At 222, an insulating layer may be applied in the lower portions of the one or more trenches. FIG. 10 shows diode 10 during an intermediate step of being manufactured according to method 200 where nitride layer 56 and nitride sidewalls 64 have been removed. The insulating layer may be applied to the entire surface of the as-yet-incomplete diode. That is, the insulating layer may be applied in lower portion 26 of the one or more trenches, upper portion 24 of the one or more trenches, and on top of gate electrode layer 18. Insulating layer 34 may, in some examples, be a combination of two or more materials, such as a thin nitride layer (e.g., approximately 50 angstroms thick) and an oxide layer (e.g., at least 350 angstroms thick). Alternatively, the insulating layer may also be a single insulating material. The insulating layer may be applied evenly to the irregular surface of the half-formed diode by any suitable methods, such as via low pressure chemical vapor deposition and/or any other appropriate means.

Figure 11:
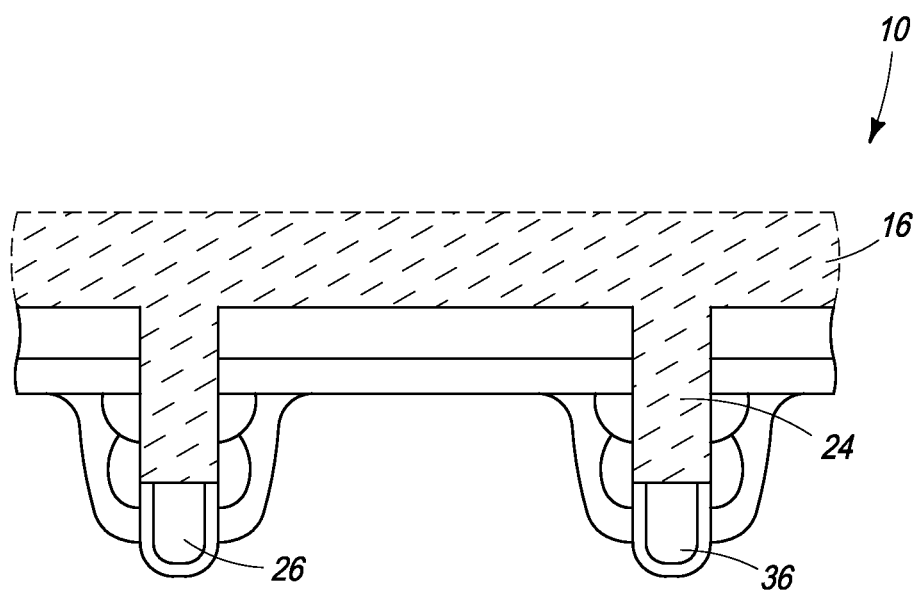

At 224, a conductive material may be deposited in the lower portion of the one or more trenches. FIG. 10 shows conductive material completely filling the one or more trenches, indicated by the heavier dashed line at the top of trenches 22. In other words, conductive material 36 may be deposited in lower portion 26 of the one or more trenches and/or in upper portion 24 of the one or more trenches. The conductive material and the insulating layer may then both be etched down (or otherwise removed) to their final location. FIG. 11 shows diode 10 during an intermediate step of being manufactured according to method 200 where conductive material 36 and the insulating layer have been etched down to their final location.

At 226, an anode electrode may be created on the gate electrode layer. The anode electrode may extend downward through the one or more trenches. In some examples, the anode electrode may contact the conductive material in the lower portion of the one or more trenches. In FIG. 11, anode electrode 16 is shown with a dashed outline and filled with dashed diagonal hatch marks. At 228, a cathode electrode may be created under the N+ substrate wafer. The cathode electrode may be created by any suitable methods, such as via backside metallization.

In some examples, method 200 may include step 202. At 202, a N buffer layer may be created on the N+ substrate wafer. For example, FIG. 2 shows N buffer layer 154 between N+ substrate layer 146 and N− bulk layer 144 in diode 110. The N buffer layer may be created, for example, by epitaxial growth on top of the N+ substrate wafer. If this step is included in method 200, then the N− bulk layer of step 204 may be created on top of the N buffer layer, for example, by epitaxial growth.

In some examples, method 200 may include step 206. At 206, one or more N regions may be created. FIG. 2 shows N region 152 disposed between two adjacent P− body regions 142. The N region(s) may be created, for example, by blanket ion implantation where the entire active area of the device is exposed. Alternately, the N region(s) may be created with the aid of masks to avoid N-type ion implantation in the future location of conducting channel 150.

In some examples, method 200 may include step 216. At 216, one or more P+ contact areas may be created in the one or more P− body regions. As step 216 would be completed after step 214 (during which the nitride walls 64 were added to the nitride layer 56 to create the trench mask), no additional masks may need to be created to create the P+ contact areas 40. The P+ contact areas may be created by any suitable process, such as by ion implantation and diffusion. The diffusion of implanted ions may cause the P+ contact areas to be wider than the width of the opening in the mask. The depth of the P+ contact areas may, for example, be controlled by controlling the energy of the ions being implanted.

In some examples, method 200 may include step 218. At 218, one or more N+ contact areas may be created in the one or more P− body regions. As step 218 would be completed after step 214 (in which nitride walls 64 were added to nitride layer 56 to create the trench mask), no additional masks may need to be created to create the N+ contact areas 38. The N+ contact areas may be created by the process of ion implantation and diffusion. The diffusion of the implanted ions may cause the N+ contact areas to be wider than the width of the opening in the mask. The depth of the N+ contact areas may be controlled, for example, by controlling the energy of the ions being implanted.

The steps of method 200 have been described above in a particular order but the individual steps may be completed in any suitable order and that additional steps may be added. Furthermore, other examples of method 200 may omit or modify one or more steps.

Figure 4:
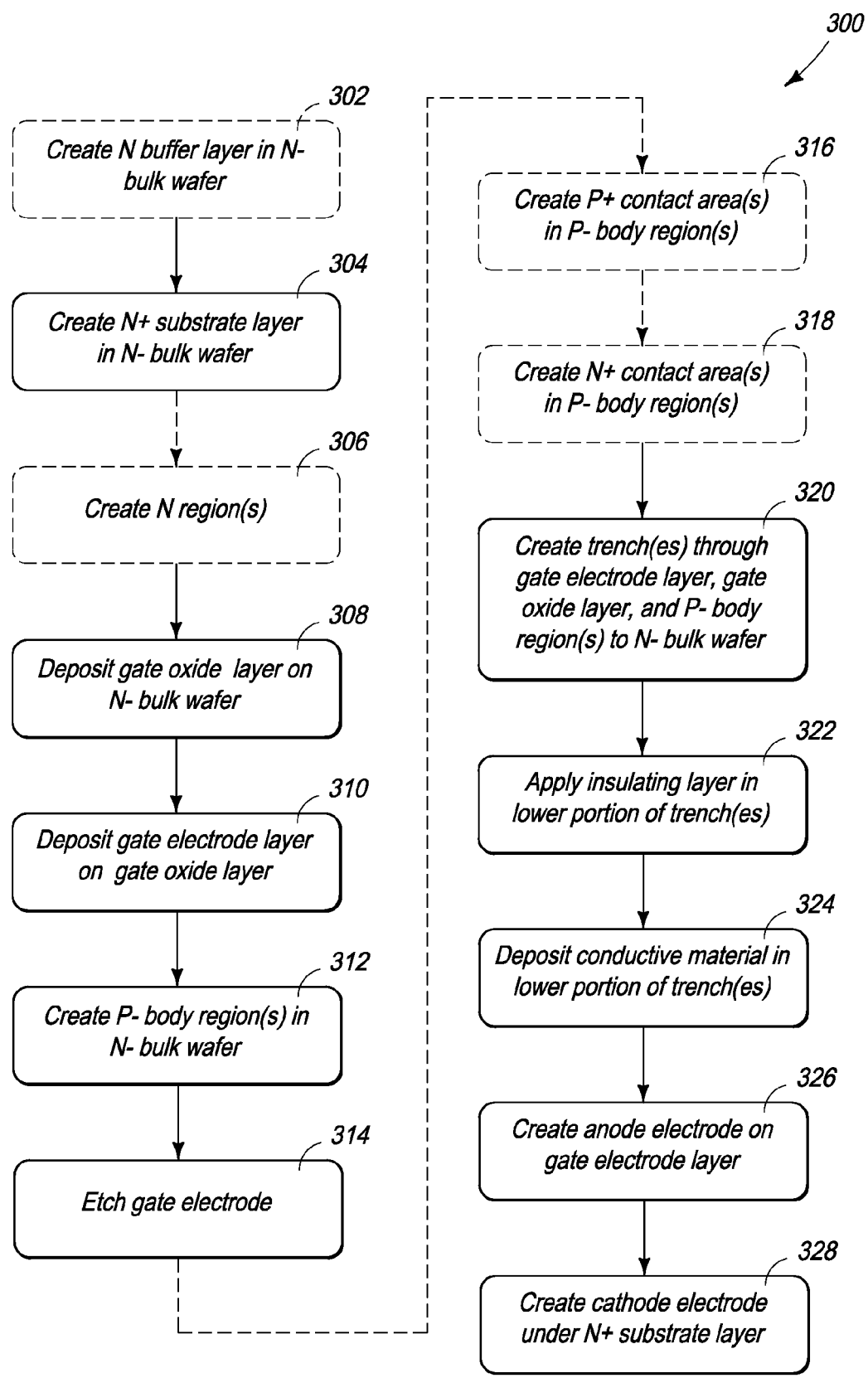
FIG. 4 is a flow chart of another example of a method of manufacturing a diode.

FIG. 4 shows an example of a method of manufacturing a diode (such as diode 10 or 110), which is generally indicated at 300. FIGS. 5-11 illustrate various steps of method 300 similar to how those figures illustrate the steps of method 200 as described above.

At 304, a N+ substrate layer may be created in a N− bulk wafer. The N− bulk wafer may be created by the float-zone method and/or any suitable method(s). The N+ substrate layer may be created, for example, by the process of ion implantation and diffusion. The depth and thickness of the N+ substrate layer may be controlled by controlling the energy of the ions being implanted. The N+ substrate layer may be created at the bottom edge of the N− bulk wafer in preparation for making contact with the cathode electrode in a subsequent step.

At 308, a gate oxide layer may be deposited on the N− bulk wafer. The gate oxide layer may be an insulating layer composed of silicon dioxide, silicon oxynitride, and/or any other suitable dielectric material(s). At 310, a gate electrode layer may be deposited on the gate oxide layer.

At 312, one or more P− body regions may be created in the N− bulk layer. Creating the one or more P− body regions may include, for example, depositing a nitride layer on the gate electrode layer and/or depositing a photoresist layer on the nitride layer. At 314, the gate electrode layer may be etched or otherwise removed.

At 320, one or more trenches may be created through the gate oxide layer and the one or more P− body regions to the N− bulk wafer. At 322, an insulating layer may be applied in the lower portions of the one or more trenches. At 324, a conductive material may be deposited in the lower portion of the one or more trenches.

At 326, an anode electrode may be created on the gate electrode layer. The anode electrode may extend downward through the one or more trenches. In some examples, the anode electrode may contact the conductive material in the lower portion of the one or more trenches. At 328, a cathode electrode may be created under the N+ substrate wafer. The cathode electrode may be created by any suitable methods, such as via backside metallization.

In some examples, method 300 may include step 302. At 302, a N buffer layer may be created in the N− bulk wafer. For example, FIG. 2 shows N buffer layer 154 between N+ substrate layer 146 and N− bulk layer 144 in diode 110. The N buffer layer may be created, for example, by ion implantation and diffusion in the N− bulk wafer. As with the N+ substrate layer the depth and thickness of the N buffer layer may be controlled by controlling the energy of the ions being implanted.

In some examples, method 300 may include step 306. At 306, one or more N regions may be created. FIG. 2 shows N region 152 disposed between two adjacent P− body regions 142. The N region(s) may be created, for example, by blanket ion implantation where the entire active area of the device is exposed. Alternately, the N region(s) may be created with the aid of masks to avoid N-type ion implantation in the future location of conducting channel 150.

In some examples, method 300 may include step 316. At 316, one or more P+ contact areas may be created in the one or more P− body regions. As step 316 would be completed after step 314 (during which the nitride walls 64 were added to the nitride layer 56 to create the trench mask), no additional masks may need to be created to create the P+ contact areas 40. The P+ contact areas may be created by any suitable process, such as by ion implantation and diffusion. The diffusion of implanted ions may cause the P+ contact areas to be wider than the width of the opening in the mask. The depth of the P+ contact areas may, for example, be controlled by controlling the energy of the ions being implanted.

In some examples, method 300 may include step 318. At 318, one or more N+ contact areas may be created in the one or more P− body regions. As step 318 would be completed after step 314 (in which nitride walls 64 were added to nitride layer 56 to create the trench mask), no additional masks may need to be created to create the N+ contact areas 38. The N+ contact areas may be created by the process of ion implantation and diffusion. The diffusion of the implanted ions may cause the N+ contact areas to be wider than the width of the opening in the mask. The depth of the N+ contact areas may be controlled, for example, by controlling the energy of the ions being implanted.

The steps of method 300 have been described above in a particular order but it should be understood that the individual steps may be completed in any suitable order and that additional steps may be added. For example, steps 302 and 304 where the N buffer and N+ substrate layers are created in the N− bulk wafer could be done in either order. Furthermore, other examples of method 300 may omit or modify one or more steps.

The disclosure set forth above may encompass multiple distinct inventions with independent utility. Although each of these inventions has been disclosed in its preferred form(s), the specific embodiments thereof as disclosed and illustrated herein are not to be considered in a limiting sense, because numerous variations are possible. The subject matter of the inventions includes all novel and nonobvious combinations and subcombinations of the various elements, features, functions, and/or properties disclosed herein. The following claims particularly point out certain combinations and subcombinations regarded as novel and nonobvious. Inventions embodied in other combinations and subcombinations of features, functions, elements, and/or properties may be claimed in applications claiming priority from this or a related application. Such claims, whether directed to a different invention or to the same invention, and whether broader, narrower, equal, or different in scope to the original claims, also are regarded as included within the subject matter of the inventions of the present disclosure.

What is claimed is:

1. A diode, comprising:
   a cathode assembly including:
      a cathode electrode,
      a N+ substrate layer over the cathode electrode, and
      a N− bulk layer over the N+ substrate layer; and
   an anode assembly including:
      an anode electrode,
      a gate electrode layer under the anode electrode, the gate electrode layer being shorted to the anode electrode,
      a gate oxide layer under the gate electrode layer,
      at least one P− body region under the gate oxide layer, and
      at least one trench that extends through the gate electrode layer, the gate oxide layer, and the at least one P− body region to the N− bulk layer, wherein the at least one trench includes an upper portion and a lower portion, the lower portion having a bottom and a plurality of sidewalls defining a bottom volume, the bottom and the plurality of sidewalls having an insulating layer, the lower portion further having a conductive material that is disposed within the bottom volume and that is in electrical communication with the anode electrode, the insulating layer being configured to electrically insulate the conductive material from the N− bulk layer, and wherein the anode electrode extends through the upper portion of the at least one trench to the conductive material.

2. The diode of claim 1, wherein the at least one P− body region includes at least one of a N+ contact area and a P+ contact area, the at least one of a N+ contact area and a P+ contact area being in ohmic contact with the anode electrode in the upper portion of the at least one trench.

3. The diode of claim 1, further comprising at least one N region disposed between two P− body regions of the at least one P− body region, the at least one N region being configured to reduce parasitic resistance.

4. The diode of claim 1, wherein the cathode assembly further includes a N buffer layer disposed between the N− bulk layer and the N+ substrate layer.

5. The diode of claim 1, wherein the gate oxide layer has a first thickness and the insulating layer has a second thickness, the second thickness being larger than the first thickness.

6. The diode of claim 1, wherein the at least one trench is U-shaped.

* * * * *